(12) United States Patent
Kim

(10) Patent No.: US 11,107,547 B2
(45) Date of Patent: Aug. 31, 2021

(54) SEMICONDUCTOR DEVICES AND SEMICONDUCTOR SYSTEMS THAT OPERATE WITH STROBE SIGNAL DURING TEST MODE

(71) Applicant: SK hynix Inc., Icheon-si (KR)

(72) Inventor: Kwang Soon Kim, Hanam-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/514,622

(22) Filed: Jul. 17, 2019

(65) Prior Publication Data

US 2020/0227129 A1 Jul. 16, 2020

(30) Foreign Application Priority Data

Jan. 15, 2019 (KR) .................... 10-2019-0005340

(51) Int. Cl.
| | |
|---|---|
| *G11C 29/38* | (2006.01) |
| *G11C 7/22* | (2006.01) |
| *G11C 7/10* | (2006.01) |
| *G11C 29/14* | (2006.01) |
| *G11C 8/12* | (2006.01) |

(52) U.S. Cl.
CPC .............. *G11C 29/38* (2013.01); *G11C 7/106* (2013.01); *G11C 7/1066* (2013.01); *G11C 7/1087* (2013.01); *G11C 7/1093* (2013.01); *G11C 7/1096* (2013.01); *G11C 7/222* (2013.01); *G11C 8/12* (2013.01); *G11C 29/14* (2013.01)

(58) Field of Classification Search
CPC ...... G11C 29/38; G11C 7/1066; G11C 7/1096; G11C 7/14; G11C 7/1087; G11C 7/222; G11C 7/106; G11C 7/1093; G11C 8/12
See application file for complete search history.

(56) References Cited

U.S. PATENT DOCUMENTS

| 2006/0268624 A1* | 11/2006 | Jang ...................... G11C 29/32 365/189.011 |
| 2010/0182857 A1* | 7/2010 | Arai .................. G11C 29/56012 365/193 |
| 2010/0327954 A1* | 12/2010 | Sakamoto .............. G11C 29/12 327/519 |

(Continued)

FOREIGN PATENT DOCUMENTS

KR 101075493 B1 10/2011

*Primary Examiner* — Sultana Begum
(74) *Attorney, Agent, or Firm* — William Park & Associates Ltd.

(57) ABSTRACT

A semiconductor system includes a first semiconductor device and a second semiconductor device. The first semiconductor device outputs a chip selection signal, a command/address signal and a clock signal. The first semiconductor device outputs first external data and a strobe signal during a write operation in a test mode and receives second external data to adjust an output moment of the strobe signal during a read operation in the test mode. The second semiconductor device is synchronized with the strobe signal to latch input data generated from the first external data during the write operation according to the chip selection signal and the command/address signal. The second semiconductor device generates output data from the input data and outputs the output data as the second external data during the read operation according to the chip selection signal and the command/address signal.

19 Claims, 11 Drawing Sheets

(56) References Cited

U.S. PATENT DOCUMENTS

| | | | |
|---|---|---|---|
| 2012/0002494 A1* | 1/2012 | Kim | G11C 29/46 365/201 |
| 2013/0311717 A1* | 11/2013 | Kim | G11C 11/1693 711/104 |
| 2014/0089575 A1 | 3/2014 | Mes | |
| 2018/0061472 A1* | 3/2018 | Hyun | G11C 5/06 |

* cited by examiner

FIG. 2

| GENERATION SIGNAL | CLK EDGE | CS | CA<1> | CA<2> | CA<3> | CA<4> | CA<5> | CA<6> |
|---|---|---|---|---|---|---|---|---|
| RD | Rising | H | L | H | L | L | L | X |
| WTF | Rising | H | L | L | L | L | L | H |
| | Rising | L | H | H | H | L | L | L |
| RDF | Rising | H | L | L | L | L | L | H |
| | Rising | L | H | L | L | L | L | L |

SEMICONDUCTOR DEVICES AND SEMICONDUCTOR SYSTEMS THAT OPERATE WITH STROBE SIGNAL DURING TEST MODE

CROSS-REFERENCE TO RELATED APPLICATIONS

The present application claims priority under 35 U.S.C 119(a) to Korean Application No. 10-2019-0005340, filed on Jan. 15, 2019, which is incorporated herein by reference in its entirety.

BACKGROUND

1. Technical Field

Embodiments of the present disclosure generally relate to semiconductor devices relating to a test mode and semiconductor systems including the same.

2. Related Art

In general, semiconductor memory devices such as double data rate synchronous dynamic random access memory (DDR SDRAM) devices are configured to perform a read operation or a write operation according to a command provided by an external chip set device. In order that the semiconductor memory devices perform the read operation or the write operation, each of the semiconductor memory devices may be designed to include various internal circuits, particularly, a pipe latch circuit for efficiently controlling a large amount of data.

Moreover, the semiconductor memory devices have been designed to use a strobe signal for synchronizing the read operation or the write operation for the data used in the read operation or the write operation. In such a case, the semiconductor memory devices are designed to operate in a test mode for controlling generation moments of the data and the strobe signal before the read operation or the write operation in order to prevent error occurrence during the read operation or the write operation.

SUMMARY

According to an embodiment, a semiconductor system may include a first semiconductor device and a second semiconductor device. The first semiconductor device may be configured to output a chip selection signal, a command/address signal and a clock signal. The first semiconductor device may be configured to output first external data and a strobe signal during a write operation in a test mode and receives second external data to adjust an output moment of the strobe signal during a read operation in the test mode. The second semiconductor device may be synchronized with the strobe signal to latch input data generated from the first external data during the write operation according to the chip selection signal and the command/address signal. The second semiconductor device may be configured to generate output data from the input data and outputs the output data as the second external data during the read operation according to the chip selection signal and the command/address signal.

According to an embodiment, a semiconductor device may include a control signal generation circuit and a data input/output (I/O) circuit. The control signal generation circuit may be configured to generate an input control signal which is enabled during a write operation in a test mode and generates an output control signal which is enabled during a read operation in the test mode. The data input/output (I/O) circuit may be configured to generate write data from input data in synchronization with a strobe signal to transmit the write data to an I/O line. The data I/O circuit may be configured to store read data generated from the write data transmitted to the I/O line when the input control signal is inputted to the data I/O circuit and may output the stored read data as output data when the output control signal is inputted to the data I/O circuit.

BRIEF DESCRIPTION OF THE DRAWINGS

FIG. 2 is a table illustrating an operation of a control circuit included in the semiconductor system of FIG. 1.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
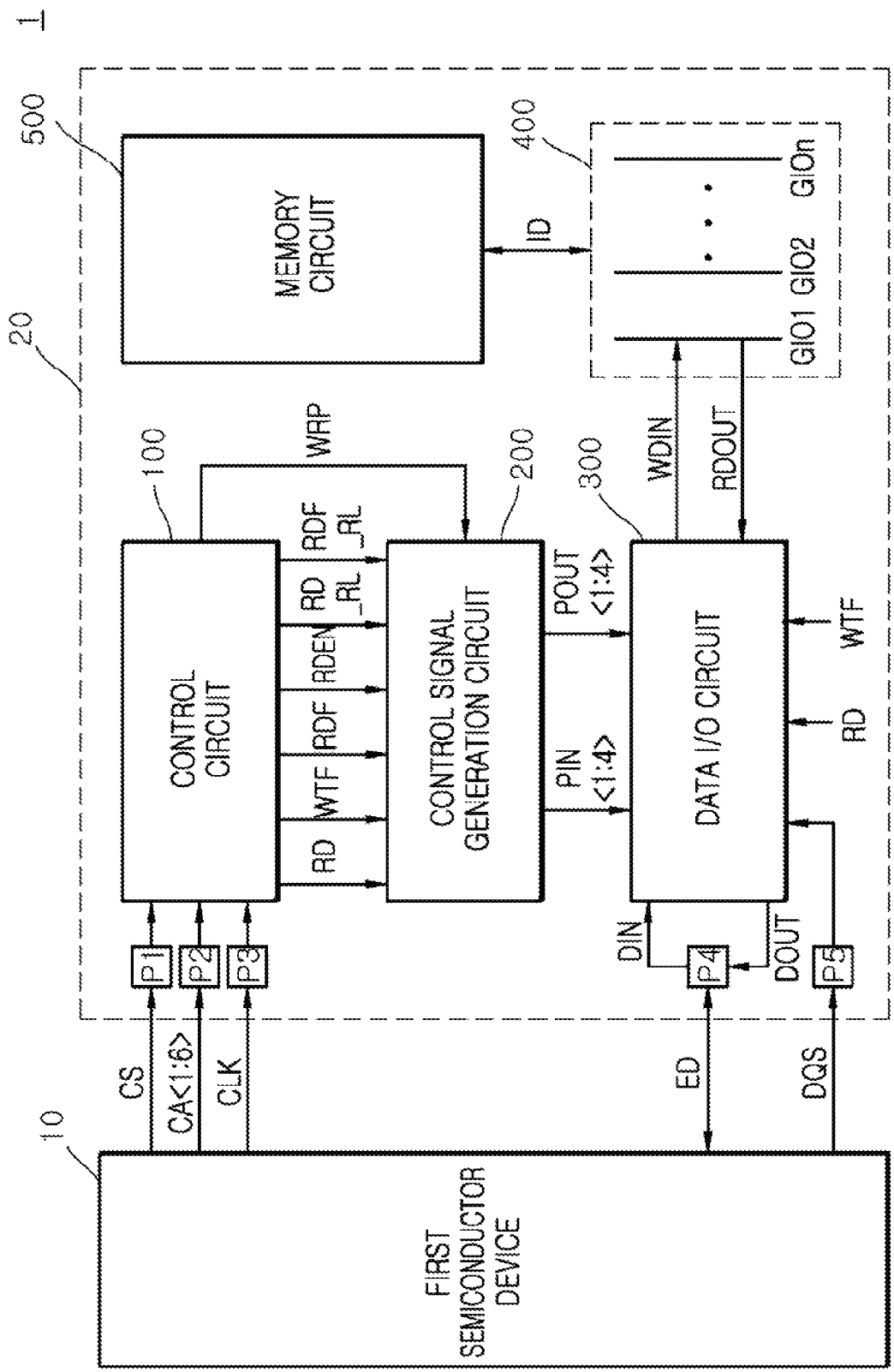
FIG. 1 is a block diagram illustrating a configuration of a semiconductor system according to an embodiment of the present disclosure.

As illustrated in FIG. 1, a semiconductor system 1 according to an embodiment may include a first semiconductor device 10 and a second semiconductor device 20.

The first semiconductor device 10 may output a chip selection signal CS, first to sixth command/address signals CA<1:6> and a clock signal CLK. The first semiconductor device 10 may output external data ED and a strobe signal DQS while a write operation is performed in a test mode. In an embodiment, the test mode is an operation mode for adjusting output moments of the strobe signal and the first external data that determine a point of time for detecting logic levels of the first external data. In an embodiment, the test mode is an operation mode for adjusting a generation moment of the strobe signal and an input moment of the input data when a logic level combination of the output data is different from a logic level combination of the input data. In some embodiments, the write operation and the read operation are sequentially performed while the semiconductor system 1 is in the test mode. The first semiconductor device 10 may receive the external data ED while the write operation is performed in the test mode. The first semiconductor device 10 may adjust generation moments of the external data ED and the strobe signal DQS if a logic level combination of the external data ED inputted to the first semiconductor device 10 during the read operation in the test mode is inconsistent with a logic level combination of the external data ED outputted from the first semiconductor device 10 during the write operation in the test mode. For example, the first semiconductor device 10 may advance or delay the generation moment of the external data ED if a logic level combination of the external data ED inputted to the first semiconductor device 10 during the read operation in the test mode is inconsistent with a logic level combination of the external data ED outputted from the first semiconductor device 10 during the write operation in the test mode. The first semiconductor device 10 may advance or delay the generation moment of the strobe signal DQS if a logic level combination of the external data ED inputted to the first semiconductor device 10 during the read operation in the test mode is inconsistent with a logic level combination of the external data ED outputted from the first semiconductor device 10 during the write operation in the test mode. The first semiconductor device 10 may output the external data ED and the strobe signal DQS, generation moments of which are adjusted, if the test mode terminates. The first semiconductor device 10 may output the external data ED and the strobe signal DQS while the write operation is performed in a normal mode. The first semiconductor device 10 may receive the external data ED while the read operation is performed in the normal mode.

The second semiconductor device 20 may include first to fifth pads P1, P2, P3, P4 and P5, a control circuit 100, a control signal generation circuit 200, a data I/O circuit 300, an I/O line group 400 and a memory circuit 500.

The chip selection signal CS may be inputted to the control circuit 100 through the first pad P1. The first to sixth command/address signals CA<1:6> may be inputted to the control circuit 100 through the second pad P2. The clock signal CLK may be inputted to the control circuit 100 through the third pad P3. The external data ED may be inputted to the data I/O circuit 300 as input data DIN through the fourth pad P4 during the write operation in the test mode. While the read operation is performed in the test mode, the data I/O circuit 300 may generate output data DOUT and the output data DOUT generated by the data I/O circuit 300 may be inputted to the first semiconductor device 10 as the external data ED through the fourth pad P4. The strobe signal DQS may be inputted to the data I/O circuit 300 through the fifth pad P5. Although the second pad P2 is illustrated as a single pad in FIG. 1, the second pad P2 may be configured to include a plurality of pads, the number of which is equal to the number of bits included in the first to sixth command/address signals CA<1:6>.

The control circuit 100 may be synchronized with the clock signal CLK to generate a read signal RD, a write test signal WTF and a read test signal RDF according to a logic level combination of the chip selection signal CS and the first to sixth command/address signals CA<1:6>. The control circuit 100 may generate a read enablement signal RDEN which is enabled if the read test signal RDF is generated. The control circuit 100 may delay the read signal RD in synchronization with the clock signal CLK to generate a read delay signal RD_RL. The control circuit 100 may delay the read test signal RDF in synchronization with the clock signal CLK to generate a read test delay signal RDF_RL. Logic level combinations of the chip selection signal CS and the first to sixth command/address signals CA<1:6> for generating the read signal RD, the write test signal WTF and the read test signal RDF in the control circuit 100 will be described with reference to FIG. 2. The control circuit 100 may generate a write/read pulse signal WRP including pulses which are generated during the read operation and the write operation in the test mode.

The control signal generation circuit 200 may generate first to fourth input control signals PIN<1:4> which are enabled according to the read signal RD, the write test signal WTF, the read test signal RDF and the read enablement signal RDEN and may generate first to fourth output control signals POUT<1:4> which are enabled if the read delay signal RD_RL and the read test delay signal RDF_RL are inputted to the control signal generation circuit 200. The control signal generation circuit 200 may generate the first to fourth input control signals PIN<1:4> which are sequentially enabled by a pulse of the write/read pulse signal WRP if any one of the read signal RD and the write test signal WTF is inputted to the control signal generation circuit 200. The control signal generation circuit 200 may generate the first to fourth output control signals POUT<1:4> which are sequentially enabled if any one of the read delay signal RD_RL and the read test delay signal RDF_RL is inputted to the control signal generation circuit 200.

The data I/O circuit 300 may latch the input data DIN in synchronization with the strobe signal DQS to generate write data WDIN. The data I/O circuit 300 may be synchronized with the strobe signal DQS to generate the write data WDIN from the input data DIN if the write test signal WTF is inputted to the data I/O circuit 300. The write data WDIN may be transmitted through any one of a plurality of I/O lines GIO1~GIOn included in the I/O line group 400. The data I/O circuit 300 may latch read data RDOUT which are generated from the write data WDIN transmitted through any one of the plurality of I/O lines GIO1~GIOn if the first to fourth input control signals PIN<1:4> are inputted to the data I/O circuit 300. The data I/O circuit 300 may be synchronized with the strobe signal DQS to generate the output data DOUT from the read data RDOUT if any one of the write test signal WTF and the read signal RD is inputted to the data I/O circuit 300. The data I/O circuit 300 may generate the output data DOUT from the latched read data RDOUT if the first to fourth output control signals POUT<1:4> are inputted to the data I/O circuit 300.

The memory circuit 500 may store internal data ID which are generated from the write data WDIN transmitted through the I/O lines GIO1~GIOn while the write operation is performed in the normal mode. The memory circuit 500 may output the stored internal data ID through the I/O lines GIO1~GIOn while the read operation is performed in the normal mode.

The logic level combinations of the chip selection signal CS and the first to sixth command/address signals CA<1:6> for generating the read signal RD, the write test signal WTF and the read test signal RDF in the control circuit 100 will be described hereinafter with reference to FIG. 2. In FIG. 2, "H" denotes a logic "high" level, and "L" denotes a logic "low" level. In addition, in FIG. 2, "X" means a "DON'T CARE STATE". A high level and a low level, as used herein with respect to signals, refer to logic levels of the signals. A signal having a low level distinguishes from the signal when it has a high level. For example, the high level may correspond to the signal having a first voltage, and the low level may correspond to the signal having a second voltage. For some embodiments, the first voltage is greater than the second voltage. In other embodiments, different characteristics of a signal, such as frequency or amplitude, determine whether the signal has a high level or a low level. For some cases, the high and low levels of a signal represent logical binary states.

First, the logic level combination of the chip selection signal CS and the first to sixth command/address signals CA<1:6> for generating the read signal RD may be set by an example whereby the chip selection signal CS and the first to fifth command/address signals CA<1:5> inputted in synchronization with a rising edge of the clock signal CLK respectively have a logic "high" level, a logic "low" level, a logic "high" level, a logic "low" level, a logic "low" level and a logic "low" level. In such an example, the sixth command/address signal CA<6> may have a "DON'T CARE STATE".

Next, the logic level combination of the chip selection signal CS and the first to sixth command/address signals CA<1:6> for generating the write test signal WTF may be set by an example whereby the first to sixth command/address signals CA<1:6> inputted in synchronization with a rising edge of the clock signal CLK respectively have a logic "low" level, a logic "low" level, a logic "low" level, a logic "low" level, a logic "low" level and a logic "high" level while the chip selection signal CS has a logic "high" level and the first to sixth command/address signals CA<1:6> inputted in synchronization with a rising edge of the clock signal CLK then respectively have a logic "high" level, a logic "high" level, a logic "high" level, a logic "low" level, a logic "low" level and a logic "low" level while the chip selection signal CS has a logic "low" level.

Next, the logic level combination of the chip selection signal CS and the first to sixth command/address signals CA<1:6> for generating the read test signal RDF may be set by an example whereby the first to sixth command/address signals CA<1:6> inputted in synchronization with a rising edge of the clock signal CLK respectively have a logic "low" level, a logic "low" level, a logic "low" level, a logic "low" level, a logic "low" level and a logic "high" level while the chip selection signal CS has a logic "high" level and the first to sixth command/address signals CA<1:6> inputted in synchronization with a rising edge of the clock signal CLK then respectively have a logic "high" level, a logic "low" level, a logic "low" level, a logic "low" level, a logic "low" level and a logic "low" level while the chip selection signal CS has a logic "low" level.

Figure 3:
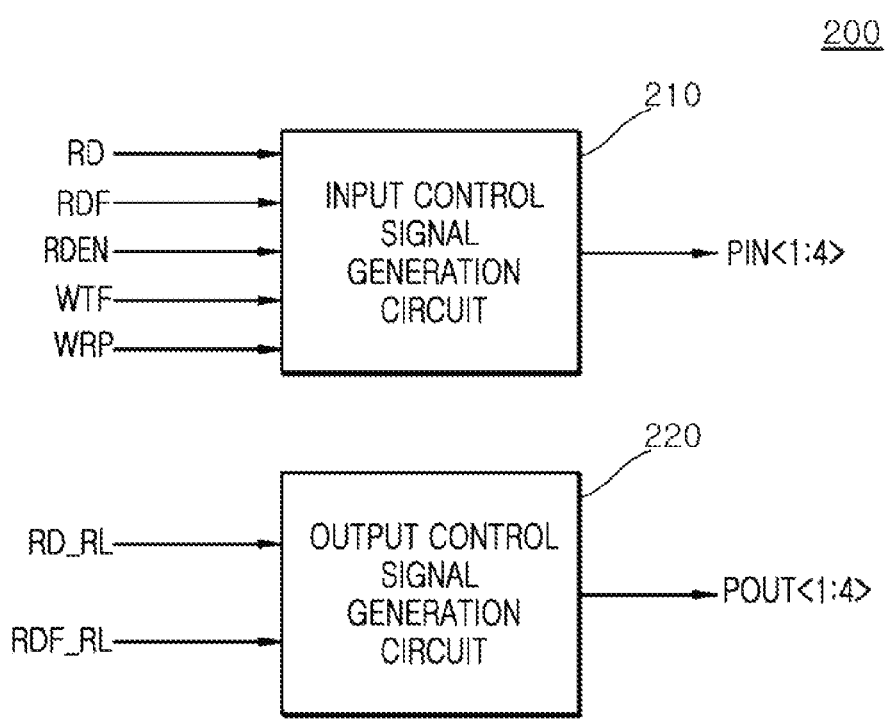
FIG. 3 is a block diagram illustrating a configuration of a control signal generation circuit included in the semiconductor system of FIG. 1.

Referring to FIG. 3, the control signal generation circuit 200 may include an input control signal generation circuit 210 and an output control signal generation circuit 220.

The input control signal generation circuit 210 may generate the first to fourth input control signals PIN<1:4> which are enabled according to the write/read pulse signal WRP if the read signal RD is inputted to the input control signal generation circuit 210. The input control signal generation circuit 210 may inhibit the read test signal RDF from being inputted to the input control signal generation circuit 210 if the read enablement signal RDEN is inputted to the input control signal generation circuit 210. The input control signal generation circuit 210 may generate the first to fourth input control signals PIN<1:4> which are enabled according to the write/read pulse signal WRP if the write test signal WTF is inputted to the input control signal generation circuit 210. The input control signal generation circuit 210 may generate the first to fourth input control signals PIN<1:4> which are sequentially enabled if any one of the read signal RD and the write test signal WTF is inputted to the input control signal generation circuit 210.

The output control signal generation circuit 220 may generate the first to fourth output control signals POUT<1:4> which are enabled if the read delay signal RD_RL is inputted to the output control signal generation circuit 220. The output control signal generation circuit 220 may generate the first to fourth output control signals POUT<1:4> which are enabled if the read test delay signal RDF_RL is inputted to the output control signal generation circuit 220. The output control signal generation circuit 220 may generate the first to fourth output control signals POUT<1:4> which are sequentially enabled if one of the read delay signal RD_RL and the read test delay signal RDF_RL is inputted to the output control signal generation circuit 220.

Figure 4:
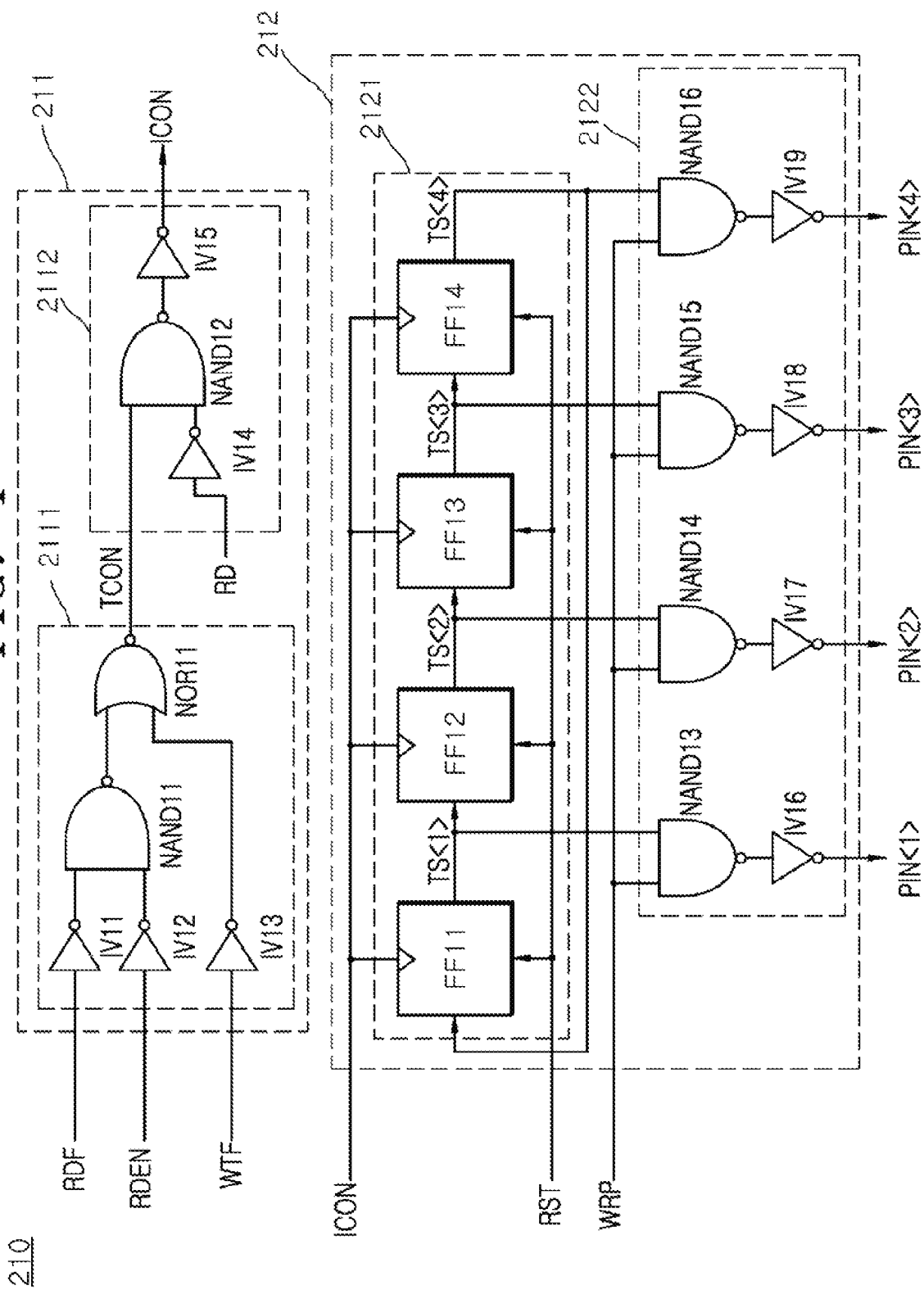
FIG. 4 is a circuit diagram illustrating a configuration of an input control signal generation circuit included in the control signal generation circuit of FIG. 3.

Referring to FIG. 4, the input control signal generation circuit 210 may include an internal input control signal generation circuit 211 and an input control signal output circuit 212.

The internal input control signal generation circuit 211 may include a transmission control signal generation circuit 2111 and a signal transmission circuit 2112.

The transmission control signal generation circuit 2111 may be configured to perform inversion, AND, and OR operations and may be realized using, for example but not limited to, inverters IV11, IV12 and IV13, a NAND gate NAND11 and a NOR gate NOR11. The transmission control signal generation circuit 2111 may inhibit the read test signal RDF from being inputted to the transmission control signal generation circuit 2111 if the read enablement signal RDEN having a logic "high" level is inputted to the transmission control signal generation circuit 2111. The transmission control signal generation circuit 2111 may generate a transmission control signal TCON having a logic "low" level if the write test signal WTF is enabled to have a logic "low" level. The transmission control signal generation circuit 2111 may generate the transmission control signal TCON having a logic "high" level if both of the read test signal RDF and the read enablement signal RDEN have a logic "low" level and the write test signal WTF has a logic "high" level.

The signal transmission circuit 2112 may generate an internal input control signal ICON having a logic "low" level if the transmission control signal TCON having a logic "low" level is inputted to the signal transmission circuit 2112. The signal transmission circuit 2112 may generate the internal input control signal ICON having a logic "low" level if the read signal RD having a logic "high" level is inputted to the signal transmission circuit 2112. The signal transmission circuit 2112 may generate the internal input control signal ICON having a logic "high" level if the transmission control signal TCON has a logic "high" level and the read signal RD has a logic "low" level.

As described above, the internal input control signal generation circuit 211 may inhibit the read test signal RDF from being inputted to the internal input control signal generation circuit 211 if the read enablement signal RDEN is inputted to the internal input control signal generation circuit 211 and may generate the internal input control signal ICON which is enabled if any one of the read signal RD and the write test signal WTF is inputted to the internal input control signal generation circuit 211.

The input control signal output circuit 212 may include a transmission signal generation circuit 2121 and a logic circuit 2122.

The transmission signal generation circuit 2121 may be realized using, for example but not limited to, flip-flops FF11, FF12, FF13 and FF14.

The flip-flop FF11 may generate a first transmission signal TS<1> which is initialized to have a logic "high" level if a reset signal RST is enabled. The flip-flop FF11 may output a fourth transmission signal TS<4> as the first transmission signal TS<1> if the internal input control signal ICON has a logic "low" level.

The flip-flop FF12 may generate a second transmission signal TS<2> which is initialized to have a logic "low" level if the reset signal RST is enabled. The flip-flop FF12 may output the first transmission signal TS<1> as the second transmission signal TS<2> if the internal input control signal ICON has a logic "low" level.

The flip-flop FF13 may generate a third transmission signal TS<3> which is initialized to have a logic "low" level if the reset signal RST is enabled. The flip-flop FF13 may output the second transmission signal TS<2> as the third transmission signal TS<3> if the internal input control signal ICON has a logic "low" level.

The flip-flop FF14 may generate a fourth transmission signal TS<4> which is initialized to have a logic "low" level if the reset signal RST is enabled. The flip-flop FF14 may output the third transmission signal TS<3> as the fourth transmission signal TS<4> if the internal input control signal ICON has a logic "low" level.

The reset signal RST may be enabled to perform an initialization operation of the semiconductor system 1.

The logic circuit 2122 may be configured to perform NAND and inversion operations and may be realized using, for example but not limited to, NAND gates NAND13, NAND14, NAND15 and NAND16 and inverters IV16, IV17, IV18 and IV19.

The NAND gate NAND13 and the inverter IV16 may be coupled in series and may buffer the first transmission signal TS<1> to generate the first input control signal PIN<1> if the write/read pulse signal WRP has a logic "high" level.

The NAND gate NAND14 and the inverter IV17 may be coupled in series and may buffer the second transmission signal TS<2> to generate the second input control signal PIN<2> if the write/read pulse signal WRP has a logic "high" level.

The NAND gate NAND15 and the inverter IV18 may be coupled in series and may buffer the third transmission signal TS<3> to generate the third input control signal PIN<3> if the write/read pulse signal WRP has a logic "high" level.

The NAND gate NAND16 and the inverter IV19 may be coupled in series and may buffer the fourth transmission signal TS<4> to generate the fourth input control signal PIN<4> if the write/read pulse signal WRP has a logic "high" level.

Figure 5:
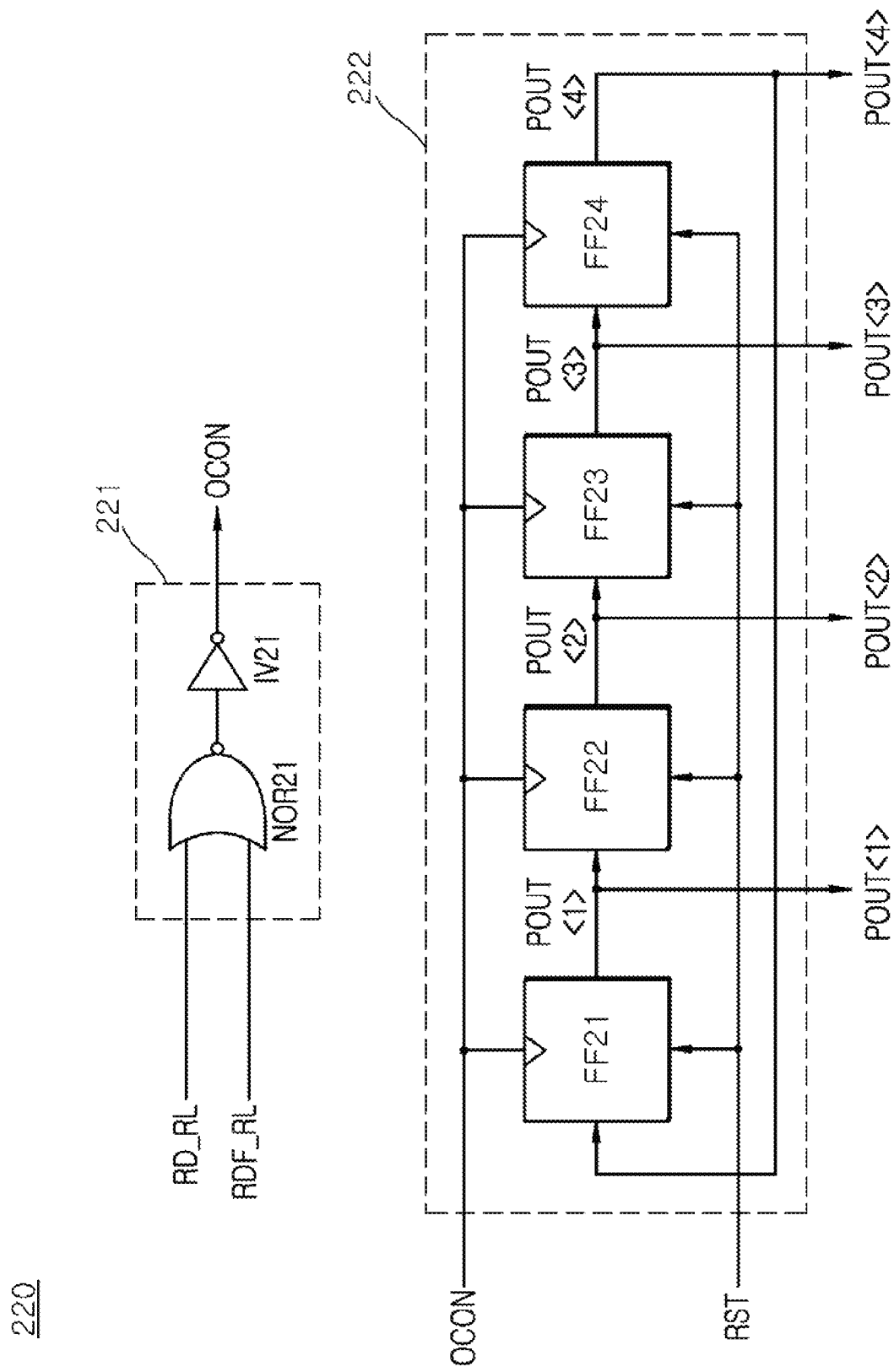
FIG. 5 is a circuit diagram illustrating a configuration of an output control signal generation circuit included in the control signal generation circuit of FIG. 3.

Referring to FIG. 5, the output control signal generation circuit 220 may include an internal output control signal generation circuit 221 and an output control signal output circuit 222.

The internal output control signal generation circuit 221 may be configured to perform NOR and inversion operation and may be realized using, for example but not limited to, a NOR gate NOR21 and an inverter IV21 which are coupled in series. The internal output control signal generation circuit 221 may generate an internal output control signal OCON having a logic "high" level if any one of the read delay signal RD_RL and the read test delay signal RDF_RL has a logic "high" level.

The output control signal output circuit 222 may be realized using flip-flops FF21, FF22, FF23 and FF24.

The flip-flop FF21 may generate the first output control signal POUT<1> which is initialized to have a logic "high" level if the reset signal RST is enabled. The flip-flop FF21 may output the fourth output control signal POUT<4> as the first output control signal POUT<1> if the internal output control signal OCON has a logic "high" level.

The flip-flop FF22 may generate the second output control signal POUT<2> which is initialized to have a logic "low" level if the reset signal RST is enabled. The flip-flop FF22 may output the first output control signal POUT<1> as the second output control signal POUT<2> if the internal output control signal OCON has a logic "high" level.

The flip-flop FF23 may generate the third output control signal POUT<3> which is initialized to have a logic "low" level if the reset signal RST is enabled. The flip-flop FF23 may output the second output control signal POUT<2> as the third output control signal POUT<3> if the internal output control signal OCON has a logic "high" level.

The flip-flop FF24 may generate the fourth output control signal POUT<4> which is initialized to have a logic "low" level if the reset signal RST is enabled. The flip-flop FF24 may output the third output control signal POUT<3> as the fourth output control signal POUT<4> if the internal output control signal OCON has a logic "high" level.

Figure 6:
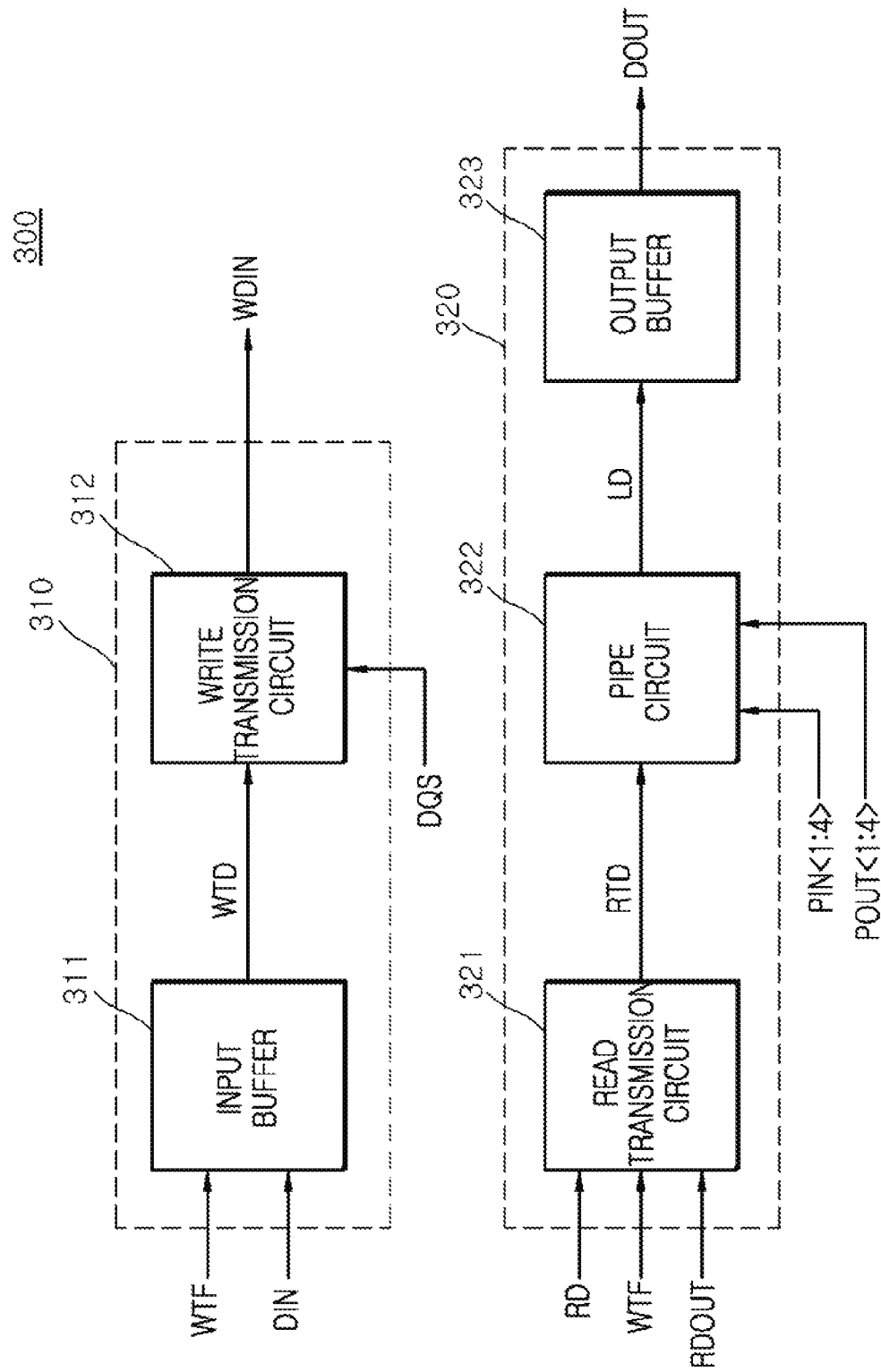
FIG. 6 is a block diagram illustrating a configuration of a data input/output (I/O) circuit included in the semiconductor system of FIG. 1.

Referring to FIG. 6, the data I/O circuit 300 may include a data input circuit 310 and a data output circuit 320.

The data input circuit 310 may include an input buffer 311 and a write transmission circuit 312.

The input buffer 311 may buffer the input data DIN to generate write transmission data WTD if the write test signal WTF is enabled. The input buffer 311 may generate the write transmission data WTD which are driven according to logic levels of the input data DIN if the write test signal WTF is enabled.

The write transmission circuit 312 may be synchronized with the strobe signal DQS to latch the write transmission data WTD and to generate the write data WDIN from the latched data of the write transmission data WTD. The write transmission circuit 312 may detect a logic level of the write transmission data WTD to generate the write data WDIN at a point of time that the strobe signal DQS is toggled. For example, the write transmission circuit 312 may generate the write data WDIN having a logic "high" level if the write transmission data WTD has a logic "high" level at a point of time that the strobe signal DQS is toggled.

The data output circuit 320 may include a read transmission circuit 321, a pipe circuit 322 and an output buffer 323.

The read transmission circuit 321 may buffer the read data RDOUT to generate read transmission data RTD if the read signal RD is enabled. The read transmission circuit 321 may buffer the read data RDOUT to generate the read transmission data RTD if the write test signal WTF is enabled.

The pipe circuit 322 may latch the read transmission data RTD if the first to fourth input control signals PIN<1:4> are enabled. The pipe circuit 322 may generate latch data LD from the latched data of the read transmission data RTD if the first to fourth output control signals POUT<1:4> are enabled.

The output buffer 323 may buffer the latch data LD to generate the output data DOUT. The output buffer 323 may generate the output data DOUT which are driven according to logic levels of the latch data LD.

Figure 7:
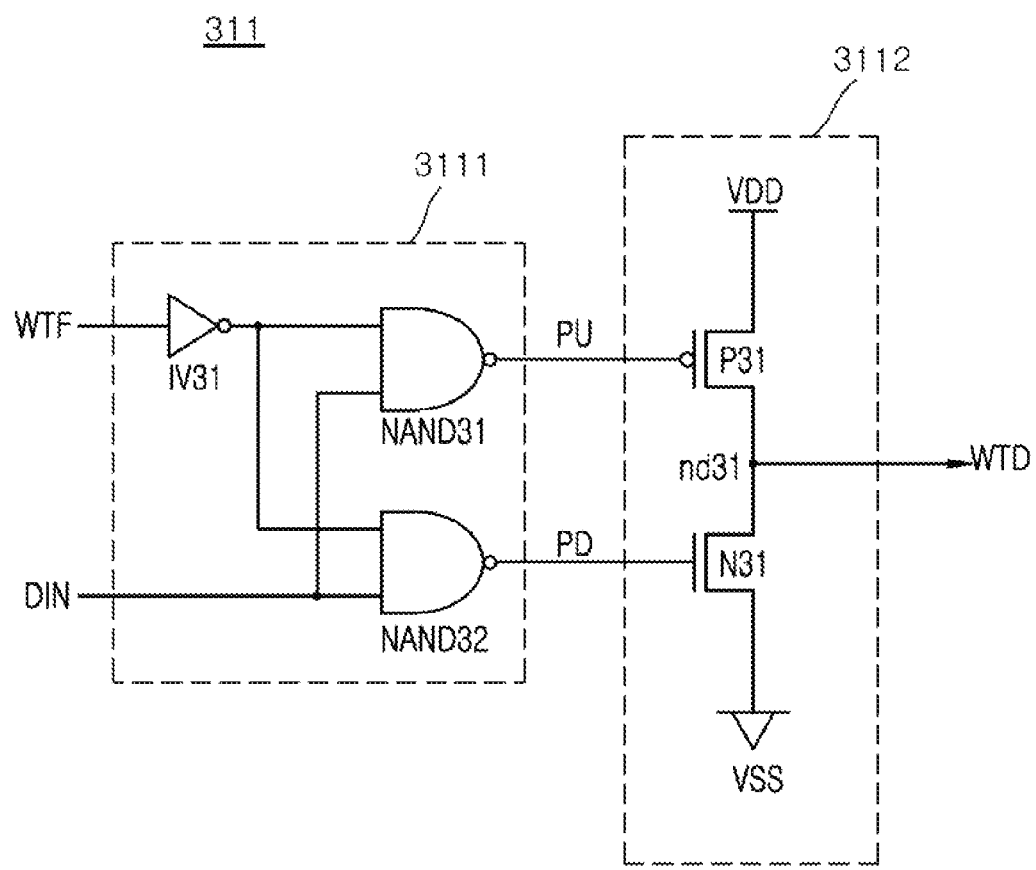
FIG. 7 is a circuit diagram illustrating a configuration of an input buffer included in the data I/O circuit of FIG. 6.

Referring to FIG. 7, the input buffer 311 may include a pull-up/pull-down signal generation circuit 3111 and a drive circuit 3112.

The pull-up/pull-down signal generation circuit 3111 may be configured to perform inversion and NAND operations and may be realized using, for example but not limited to, an inverter IV31 and NAND gates NAND31 and NAND32. The pull-up/pull-down signal generation circuit 3111 may generate a pull-up signal PU or a pull-down signal PD according to logic levels of the write test signal WTF and the input data DIN. The pull-up/pull-down signal generation circuit 3111 may generate the pull-up signal PU which is enabled to have a logic "low" level if the write test signal WTF has a logic "low" level and the input data DIN has a logic "high" level. The pull-up/pull-down signal generation circuit 3111 may generate the pull-down signal PD which is enabled to have a logic "high" level if the write test signal WTF has a logic "low" level and the input data DIN has a logic "low" level.

The drive circuit 3112 may be realized using, for example but not limited to, a PMOS transistor P31 coupled between a power supply voltage VDD terminal and a node nd31 and an NMOS transistor N31 coupled between the node nd31 and a ground voltage VSS terminal. The drive circuit 3112 may pull up the node nd31 to a level of the power supply voltage VDD to generate the write transmission data WTD having a logic "high" level, if the pull-up signal PU is enabled to have a logic "low" level. The drive circuit 3112 may pull up the node nd31 to a level of the ground voltage VSS to generate the write transmission data WTD having a logic "low" level, if the pull-down signal PD is enabled to have a logic "high" level.

Figure 8:
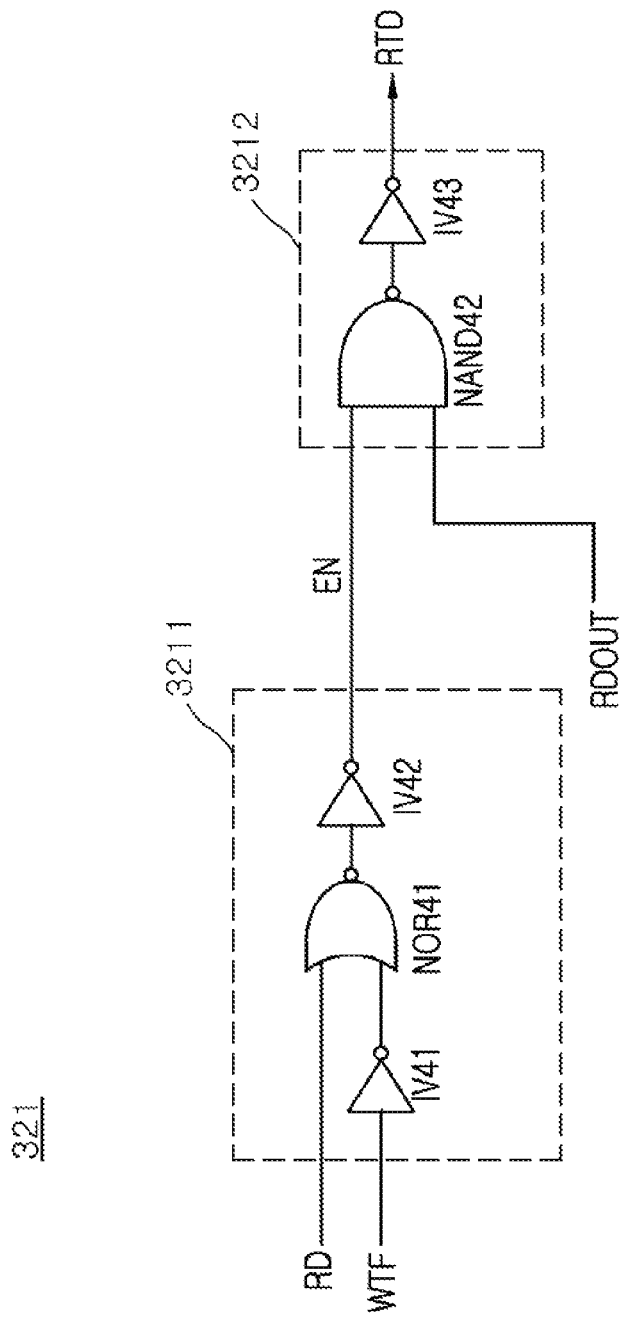
FIG. 8 is a circuit diagram illustrating a configuration of a read transmission circuit included in the data I/O circuit of FIG. 6.

Referring to FIG. 8, the read transmission circuit 321 may include an enablement signal generation circuit 3211 and a read transmission data generation circuit 3212.

The enablement signal generation circuit 3211 may be configured to perform inversion and OR operations and may be realized using, for example but not limited to, inverters IV41 and IV42 and a NOR gate NOR41. The enablement signal generation circuit 3211 may generate an enablement signal EN which is enabled if any one of the read signal RD and the write test signal WTF is enabled. The enablement signal generation circuit 3211 may generate the enablement signal EN which is enabled to have a logic "high" level if the read signal RD having a logic "high" level is inputted to the enablement signal generation circuit 3211. The enablement signal generation circuit 3211 may generate the enablement signal EN which is enabled to have a logic "high" level if the write test signal WTF having a logic "low" level is inputted to the enablement signal generation circuit 3211.

The read transmission data generation circuit 3212 may be configured to perform AND and inversion operations and may be realized using, for example but not limited to, a NAND gate NAND42 and an inverter IV43. The read transmission data generation circuit 3212 may buffer the read data RDOUT to generate the read transmission data RTD if the enablement signal EN is enabled to have a logic "high" level. The read transmission data generation circuit 3212 may inhibit the input of the read data RDOUT to generate the read transmission data RTD having a logic "low" level, if the enablement signal EN is disabled to have a logic "low" level.

Figure 9:
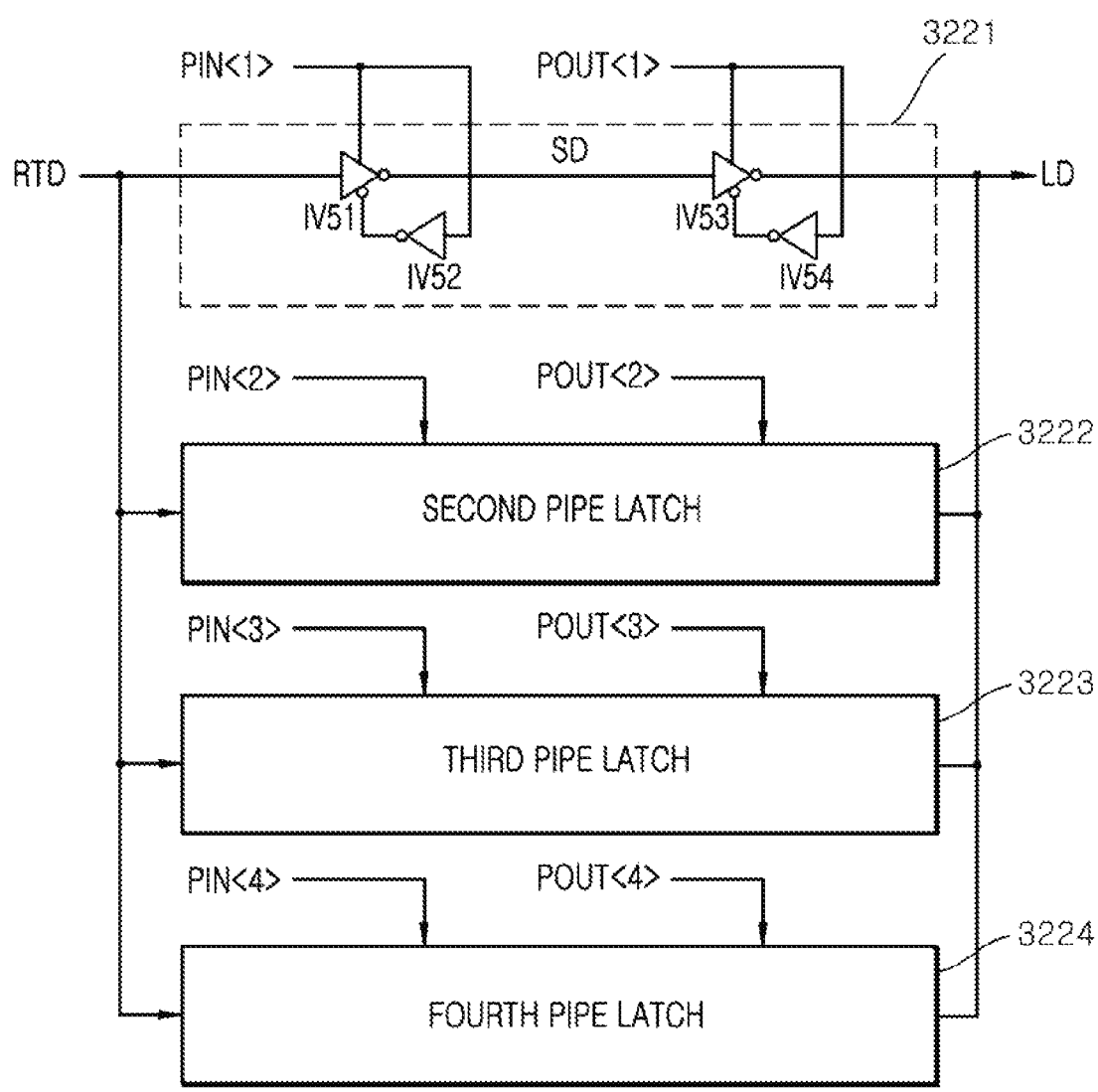
FIG. 9 illustrates a configuration of a pipe circuit included in the data I/O circuit of FIG. 6.

Referring to FIG. 9, the pipe circuit 322 may include a first pipe latch 3221, a second pipe latch 3222, a third pipe latch 3223 and a fourth pipe latch 3224.

The first pipe latch 3221 may be configured to perform inversion operations and may be realized using, for example but not limited to, inverters IV51, IV52, IV53 and IV54. The first pipe latch 3221 may receive the read transmission data RTD to generate storage data SD if the first input control signal PIN<1> is enabled to have a logic "high" level. The first pipe latch 3221 may inversely buffer the read transmission data RTD to generate the storage data SD if the first input control signal PIN<1> is enabled to have a logic "high" level. The first pipe latch 3221 may generate the latch data LD from the storage data SD if the first output control signal POUT<1> is enabled to have a logic "high" level. The first pipe latch 3221 may inversely buffer the storage data SD to generate the latch data LD if the first output control signal POUT<1> is enabled to have a logic "high" level.

Each of the second, third and fourth pipe latches 3222, 3223 and 3224 may be realized using substantially the same circuit as the first pipe latch 3221 except its I/O signals. Thus, descriptions of the second to fourth pipe latches 3222, 3223 and 3224 will be omitted hereinafter.

Operations of the semiconductor system 1 according to an embodiment will be described hereinafter with reference to FIG. 10 in conjunction with an example in which the read operation in the normal mode, the write operation in the test mode and the read operation in the test mode are successively performed.

At a point of time "T1", the first semiconductor device 10 may output the chip selection signal CS, the first to sixth command/address signals CA<1:6> and the clock signal CLK for performing the read operation. In such a case, the chip selection signal CS and the first to fifth command/address signals CA<1:5> may be outputted in synchronization with a rising edge of the clock signal CLK to respectively have a logic "high(H)" level, a logic "low(L)" level, a logic "high(H)" level, a logic "low(L)" level, a logic "low(L)" level and a logic "low(L)" level.

At a point of time "T2", the control circuit 100 may be synchronized with the clock signal CLK to generate the read signal RD including a pulse having a logic "high" level according to a logic level combination of the chip selection signal CS and the first to fifth command/address signals CA<1:5> inputted to the control circuit 100 at the point of time "T1".

The control signal generation circuit 200 may generate the first input control signal PIN<1> which is enabled to have a logic "high" level according to the read signal RD having a logic "high" level.

The memory circuit 500 may output the internal data ID stored therein as the read data RDOUT through any one of the I/O lines GIO1~GIOn during the read operation.

The data I/O circuit 300 may latch the read data RDOUT transmitted through any one of the I/O lines GIO1~GIOn according to the first input control signal PIN<1> having a logic "high" level.

At a point of time "T3", the control circuit 100 may delay the read signal RD at the point of time "T2" in synchronization with the clock signal CLK to generate the read delay signal RD_RL including a pulse having a logic "high" level.

The control signal generation circuit 200 may generate the first output control signal POUT<1> which is enabled to have a logic "high" level according to the read delay signal RD_RL having a logic "high" level.

The data I/O circuit 300 may generate the output data DOUT from the read data RDOUT latched at the point of time "T2" and may output the output data DOUT as the external data ED through the fourth pad P4, according to the first output control signal POUT<1> having a logic "high" level.

The first semiconductor device 10 may receive the external data ED.

At a point of time "T4", the first semiconductor device 10 may output the chip selection signal CS, the first to sixth command/address signals CA<1:6> and the clock signal CLK for performing the write operation in the test mode. In such a case, the chip selection signal CS and the first to sixth command/address signals CA<1:6> may be outputted in synchronization with a riding edge of the clock signal CLK to respectively have a logic "high(H)" level, a logic "low (L)" level, a logic "low(L)" level, a logic "low(L)" level, a logic "low(L)" level, a logic "low(L)" level and a logic "high(H)" level.

At a point of time "T5", the first semiconductor device 10 may output the chip selection signal CS, the first to sixth command/address signals CA<1:6> and the clock signal CLK for performing the write operation in the test mode. In such a case, the chip selection signal CS and the first to sixth command/address signals CA<1:6> may be outputted in synchronization with a riding edge of the clock signal CLK to respectively have a logic "low(L)" level, a logic "high (H)" level, a logic "high(H)" level, a logic "high(H)" level, a logic "low(L)" level, a logic "low(L)" level and a logic "low(L)" level.

The first semiconductor device 10 may output the external data ED and the strobe signal DQS. The external data ED may be outputted as the input data DIN through the fourth pad P4.

At a point of time "T6", the control circuit 100 may be synchronized with the clock signal CLK to generate the write test signal WTF including a pulse having a logic "low" level according to logic level combinations of the chip selection signal CS and the first to sixth command/address signals CA<1:6> which are inputted to the control circuit 100 at the points of time "T4" and "T5".

The control signal generation circuit 200 may generate the second input control signal PIN<2> which is enabled to have a logic "high" level according to the write test signal WTF having a logic "low" level.

The data I/O circuit 300 may latch the input data DIN in synchronization with the strobe signal DQS to generate the write data WDIN. The write data WDIN may be transmitted through any one of the I/O lines GIO1~GIOn included in the I/O line group 400.

The data I/O circuit 300 may latch the read data RDOUT generated from the write data WDIN transmitted through any one of the I/O lines GIO1~GIOn, according to the second input control signal PIN<2> having a logic "high" level.

At a point of time "T7", the first semiconductor device 10 may output the chip selection signal CS, the first to sixth command/address signals CA<1:6> and the clock signal CLK for performing the read operation in the test mode. In such a case, the chip selection signal CS and the first to sixth command/address signals CA<1:6> may be outputted in synchronization with a riding edge of the clock signal CLK to respectively have a logic "high(H)" level, a logic "low (L)" level, a logic "low(L)" level, a logic "low(L)" level, a logic "low(L)" level, a logic "low(L)" level and a logic "high(H)" level.

At a point of time "T8", the first semiconductor device 10 may output the chip selection signal CS, the first to sixth is command/address signals CA<1:6> and the clock signal CLK for performing the read operation in the test mode. In such a case, the chip selection signal CS and the first to sixth command/address signals CA<1:6> may be outputted in synchronization with a riding edge of the clock signal CLK to respectively have a logic "low(L)" level, a logic "high (H)" level, a logic "low(L)" level, a logic "low(L)" level, a logic "low(L)" level, a logic "low(L)" level and a logic "low(L)" level.

At a point of time "T9", the control circuit 100 may be synchronized with the clock signal CLK to generate the read test signal RDF including a pulse having a logic "low" level and the read enablement signal RDEN having a logic "low" level according to logic level combinations of the chip selection signal CS and the first to sixth command/address signals CA<1:6> which are inputted to the control circuit 100 at the points of time "T7" and "T8".

At a point of time "T10", the control circuit 100 may delay the read test signal RDF at the point of time "T9" in synchronization with the clock signal CLK to generate the read test delay signal RDF_RL including a pulse having a logic "high" level.

The control signal generation circuit 200 may generate the second output control signal POUT<2> which is enabled to have a logic "high" level according to the read test delay signal RDF_RL having a logic "high" level.

The data I/O circuit 300 may generate the output data DOUT from the read data RDOUT latched at the point of time "T6" and may output the output data DOUT as the external data ED through the fourth pad P4, according to the second output control signal POUT<2> having a logic "high" level.

The first semiconductor device 10 may adjust generation moments of the external data ED and the strobe signal DQS if a logic level combination of the external data ED inputted to the first semiconductor device 10 is different from a logic level combination of the external data ED outputted from the first semiconductor device 10 at the point of time "T5". Meanwhile, the first semiconductor device 10 may terminate the test mode without adjusting the generation moments of the external data ED and the strobe signal DQS if a logic level combination of the external data ED inputted to the first semiconductor device 10 is identical to a logic level combination of the external data ED outputted from the first semiconductor device 10 at the point of time "T5".

Figure 10:
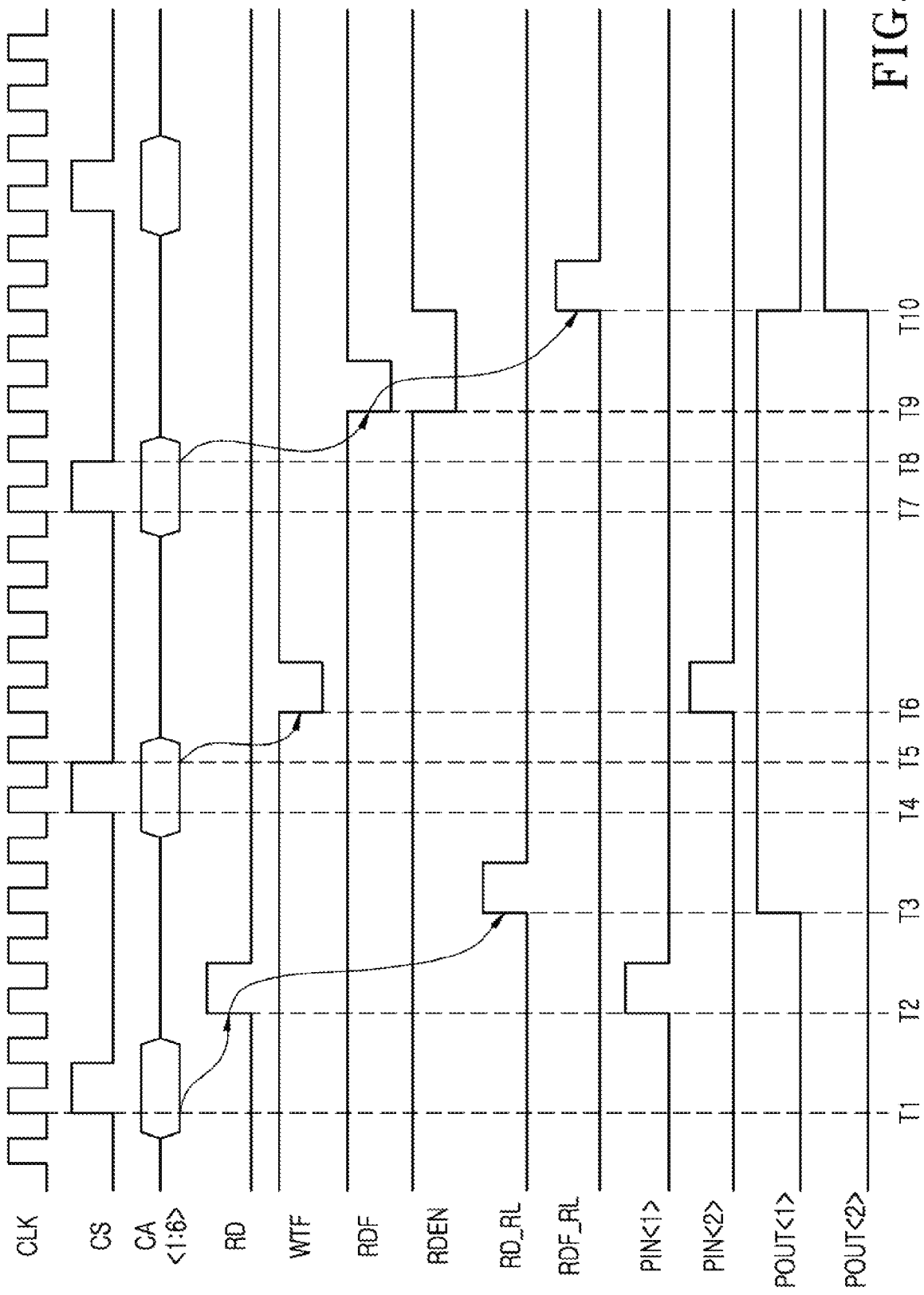
FIG. 10 is a timing diagram illustrating an operation of a semiconductor system according to an embodiment of the present disclosure.

Although FIG. 10 illustrates the write operation and the read operation performed in the test mode with the first and second input control signals PIN<1:2> and the first and second output control signals POUT<1:2>, the write operation and the read operation performed in the test mode with the third and fourth input control signals PIN<3:4> and the third and fourth output control signals POUT<3:4> may also be executed by substantially the same procedure as described with reference to FIG. 10. Thus, descriptions of the write operation and the read operation performed in the test mode with the third and fourth input control signals PIN<3:4> and the third and fourth output control signals POUT<3:4> will be omitted hereinafter.

As described above, a semiconductor system according to an embodiment may perform a test mode adjusting generation moments of data and a strobe signal without executing a write operation and a read operation using a memory circuit, thereby reducing an execution time of the test mode. In addition, the semiconductor system may directly perform a read operation without any intervening time after a write operation in the test mode, thereby reducing an execution time of the test mode.

Figure 11:
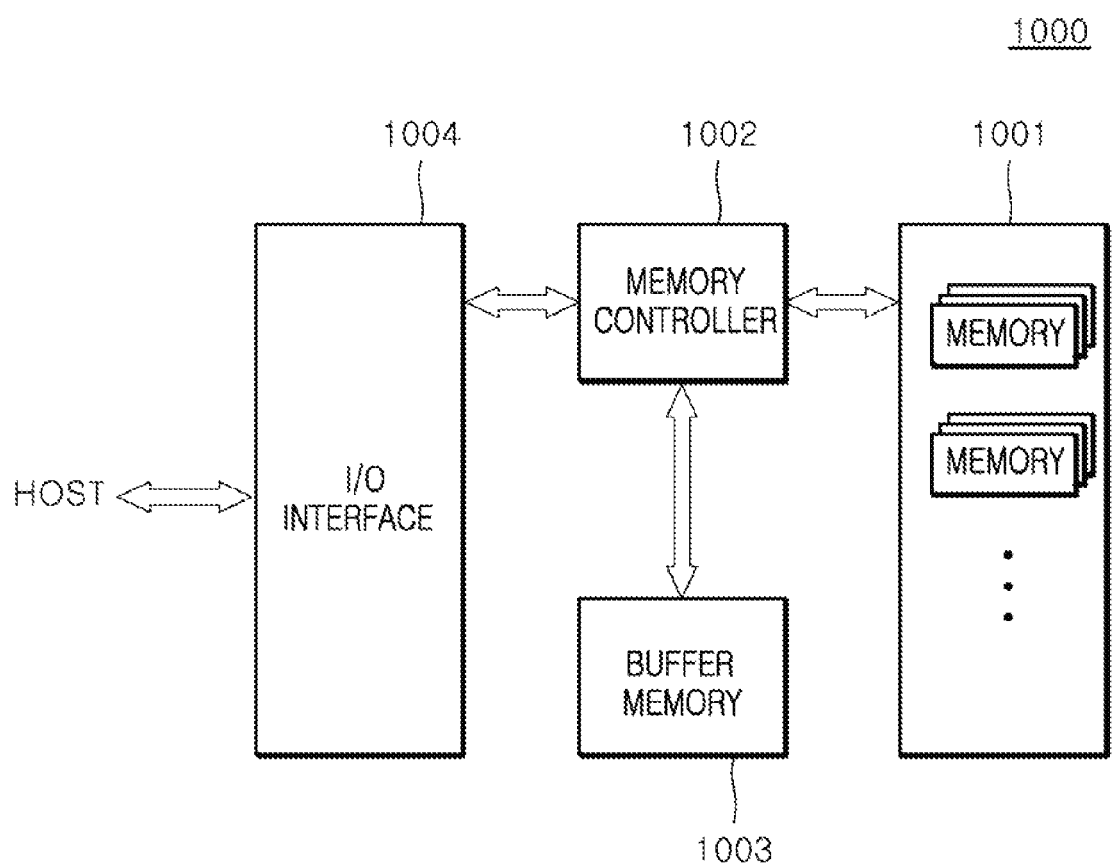
FIG. 11 is a block diagram illustrating a configuration of an electronic system employing the semiconductor system shown in FIGS. 1 to 10.

The semiconductor system described with reference to FIGS. 1 to 10 may be applied to an electronic system that includes a memory system, a graphic system, a computing system, a mobile system, or the like. For example, as illustrated in FIG. 11, an electronic system 1000 according to an embodiment may include a data storage circuit 1001, a memory controller 1002, a buffer memory 1003 and an input/output (I/O) interface 1004.

The data storage circuit 1001 may store data which are outputted from the memory controller 1002 or may read and output the stored data to the memory controller 1002, according to a control signal outputted from the memory controller 1002. The data storage circuit 1001 may include the second semiconductor devices 20 illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control operations for inputting data into the data storage circuit 1001 and the buffer memory 1003 or for outputting the data stored in the data storage circuit 1001 and the buffer memory 1003. The memory controller 1002 may include the first semiconductor devices 10 illustrated in FIG. 1. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data from the external device (i.e., the host) through the I/O interface 1004 and may output the data outputted from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor system comprising:
  a first semiconductor device configured to output a chip selection signal, a command/address signal and a clock signal, configured to output first external data and a strobe signal during a write operation in a test mode, and configured to receive second external data to adjust an output moment of the strobe signal during a read operation in the test mode; and
  a second semiconductor device configured to be synchronized with the strobe signal to latch input data generated from the first external data during the write operation according to the chip selection signal and the command/address signal and configured to generate output data from the input data and to output the output data as the second external data during the read operation according to the chip selection signal and the command/address signal,
  wherein the test mode is an operation mode for adjusting the output moment of the strobe signal when a logic level combination of the first external data outputted during the write operation is different from a logic level combination of the second external data received during the read operation.

2. The semiconductor system of claim 1, wherein the test mode is an operation mode for adjusting the output moments of the strobe signal and the first external data that determine a point of time for detecting logic levels of the first external data.

3. The semiconductor system of claim 1, wherein the write operation and the read operation are sequentially performed in the test mode.

4. The semiconductor system of claim 1, wherein the second semiconductor device comprises:
  a control circuit configured to be synchronized with the clock signal to generate a write test signal, a read test signal and a read enablement signal according to a logic level combination of the chip selection signal and the command/address signal and configured to delay the read test signal in synchronization with the clock signal to generate a read test delay signal;
  a control signal generation circuit configured to generate an input control signal which is enabled according to the write test signal, the read test signal and the read enablement signal and configured to generate an output control signal which is enabled when the read test delay signal is inputted to the control signal generation circuit; and
  a data input/output (I/O) circuit configured to latch the input data in synchronization with the strobe signal to generate write data which are loaded on an I/O line, configured to latch read data which are generated from the write data loaded on the I/O line when the input control signal is inputted to the data I/O circuit, and configured to generate the output data from the latched read data when the output control signal is inputted to the data I/O circuit.

5. The semiconductor system of claim 4, wherein the control signal generation circuit comprises:
  an input control signal generation circuit configured to inhibit the read test signal from being inputted to the input control signal generation circuit when the read enablement signal is inputted to the input control signal generation circuit and configured to generate the input control signal which is enabled according to a write/read pulse signal when the write test signal is inputted to the input control signal generation circuit; and an output control signal generation circuit configured to generate the output control signal which is enabled when the read test delay signal is inputted to the output control signal generation circuit.

6. The semiconductor system of claim 5, wherein the input control signal generation circuit comprises:

an internal input control signal generation circuit configured to inhibit the read test signal from being inputted to the internal input control signal generation circuit when the read enablement signal is inputted to the internal input control signal generation circuit and configured to generate an internal input control signal which is enabled when the write test signal is inputted to the internal input control signal generation circuit; and an input control signal output circuit configured to generate the input control signal which is enabled according to the write/read pulse signal when the internal input control signal is inputted to the input control signal output circuit.

7. The semiconductor system of claim 5, wherein the output control signal generation circuit comprises:

an internal output control signal generation circuit configured to generate an internal output control signal which is enabled when the read test delay signal is inputted to the internal output control signal generation circuit; and an output control signal output circuit configured to generate the output control signal which is enabled when the internal output control signal is inputted to the output control signal output circuit.

8. The semiconductor system of claim 4, wherein the data I/O circuit comprises:

a data input circuit configured to latch the input data in synchronization with the strobe signal to generate the write data which are transmitted through the I/O line when the write test signal is inputted to the data input circuit; and a data output circuit configured to latch the read data generated from the write data when the write test signal is enabled and the input control signal is inputted to the data output circuit and configured to generate the output data from the latched read data when the output control signal is inputted to the data output circuit.

9. The semiconductor system of claim 8, wherein the data input circuit comprises:

an input buffer configured to buffer the input data to generate write transmission data when the write test signal is enabled; and a write transmission circuit configured to be synchronized with the strobe signal to latch the write transmission data and to generate the write data from the latched write transmission data.

10. The semiconductor system of claim 8, wherein the data output circuit comprises:

a read transmission circuit configured to buffer the read data to generate a read transmission data when the write test signal is enabled;

a pipe circuit configured to latch the read transmission data when the input control signal is enabled and configured to generate latch data from the latched read transmission data when the output control signal is enabled; and an output buffer configured to buffer the latch data to generate the output data.

11. A semiconductor device comprising:

a control signal generation circuit configured to generate an input control signal which is enabled during a write operation in a test mode and configured to generate an output control signal which is enabled during a read operation in the test mode; and a data input/output (I/O) circuit configured to generate write data from input data in synchronization with a strobe signal to transmit the write data to an I/O line, configured to store read data generated from the write data transmitted to the I/O line when the input control signal is inputted to the data I/O circuit, and configured to output the stored read data as output data when the output control signal is inputted to the data I/O circuit, wherein the test mode is an operation mode for adjusting a generation moment of the strobe signal and an input moment of the input data when a logic level combination of the output data is different from a logic level combination of the input data.

12. The semiconductor device of claim 11, wherein the write operation and the read operation are sequentially performed in the test mode.

13. The semiconductor device of claim 11, wherein the control signal generation circuit comprises:

an input control signal generation circuit configured to inhibit a read test signal from being inputted to the input control signal generation circuit when a read enablement signal is inputted to the input control signal generation circuit and configured to generate the input control signal which is enabled according to a write/read pulse signal when a write test signal is inputted to the input control signal generation circuit; and an output control signal generation circuit configured to generate the output control signal which is enabled when a read test delay signal is inputted to the output control signal generation circuit.

14. The semiconductor device of claim 13, wherein the write test signal, the read test signal and the read enablement signal are enabled according to a logic level combination of a command/address signal provided by an external device; and wherein the read test delay signal is generated by delaying the read test signal.

15. The semiconductor device of claim 14, wherein the input control signal generation circuit comprises:

an internal input control signal generation circuit configured to inhibit the read test signal from being inputted to the internal input control signal generation circuit when the read enablement signal is inputted to the internal input control signal generation circuit and configured to generate an internal input control signal which is enabled when the write test signal is inputted to the internal input control signal generation circuit; and an input control signal output circuit configured to generate the input control signal which is enabled according to the write/read pulse signal when the internal input control signal is inputted to the input control signal output circuit.

16. The semiconductor device of claim 14, wherein the output control signal generation circuit comprises:
- an internal output control signal generation circuit configured to generate an internal output control signal which is enabled when the read test delay signal is inputted to the internal output control signal generation circuit; and
- an output control signal output circuit configured to generate the output control signal which is enabled when the internal output control signal is inputted to the output control signal output circuit.

17. The semiconductor device of claim 11, wherein the data I/O circuit comprises:
- a data input circuit configured to latch the input data in synchronization with the strobe signal to generate the write data which are transmitted through the I/O line when the write test signal is inputted to the data input circuit; and
- a data output circuit configured to latch the read data generated from the write data when the write test signal is enabled and the input control signal is inputted to the data output circuit and configured to generate the output data from the latched read data when the output control signal is inputted to the data output circuit.

18. The semiconductor device of claim 17, wherein the data input circuit comprises:
- an input buffer configured to buffer the input data to generate write transmission data when the write test signal is enabled; and
- a write transmission circuit configured to be synchronized with the strobe signal to latch the write transmission data and to generate the write data from the latched write transmission data.

19. The semiconductor device of claim 17, wherein the data output circuit comprises:
- a read transmission circuit configured to buffer the read data to generate a read transmission data when the write test signal is enabled;
- a pipe circuit configured to latch the read transmission data when the input control signal is enabled and configured to generate latch data from the latched read transmission data when the output control signal is enabled; and
- an output buffer configured to buffer the latch data to generate the output data.

\* \* \* \* \*